United States Patent [19]

Chen

[11] Patent Number: 5,675,620

[45] Date of Patent: Oct. 7, 1997

[54] HIGH-FREQUENCY PHASE LOCKED LOOP CIRCUIT

[75] Inventor: Dao-Long Chen, Fort Collins, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 329,367

[22] Filed: Oct. 26, 1994

[51] Int. Cl.$^6$ ............................................. H03D 3/24
[52] U.S. Cl. ............................. 375/376; 331/2; 331/25
[58] Field of Search .............................. 375/376, 215, 375/373, 362; 331/1 A, 1 R, 2, 10–12, 18, 25; 327/156, 157, 158, 159, 160, 161, 162

[56] References Cited

U.S. PATENT DOCUMENTS

| | | | |
|---|---|---|---|
| 3,621,452 | 11/1971 | Ho | 331/25 |
| 3,832,713 | 8/1974 | Rubin | 343/100 SA |
| 3,849,721 | 11/1974 | Calvert | 324/6 |
| 3,893,042 | 7/1975 | Whitman et al. | 331/55 |
| 4,072,905 | 2/1978 | Keelty | 331/1 A |
| 4,121,172 | 10/1978 | Garde | 331/2 |
| 4,234,852 | 11/1980 | McCorkle | 375/376 |
| 4,234,929 | 11/1980 | Riley, Jr. | 364/701 |
| 4,298,986 | 11/1981 | Hughes | 375/330 |
| 4,322,692 | 3/1982 | Brewerton et al. | 331/2 |
| 4,368,437 | 1/1983 | Reuter | 331/2 |
| 4,539,531 | 9/1985 | Thomas et al. | 331/11 |
| 4,551,790 | 11/1985 | Scala et al. | 331/2 |
| 4,814,727 | 3/1989 | Mower | 331/2 |
| 5,059,926 | 10/1991 | Karczewski | 331/47 |
| 5,075,639 | 12/1991 | Taya | 375/376 |
| 5,124,569 | 6/1992 | Phillips | 307/262 |
| 5,194,828 | 3/1993 | Kato et al. | 331/1 A |
| 5,237,290 | 8/1993 | Banu et al. | 331/2 |
| 5,258,877 | 11/1993 | Leake et al. | 375/376 |
| 5,299,237 | 3/1994 | Head | 375/376 |
| 5,406,591 | 4/1995 | Watanabe | 375/376 |
| 5,410,571 | 4/1995 | Yonekawa et al. | 375/376 |

FOREIGN PATENT DOCUMENTS

| | | |
|---|---|---|
| 366326 | 5/1990 | European Pat. Off. . |
| 662875 | 12/1991 | France . |
| 3400289 | 7/1985 | Germany . |

*Primary Examiner*—Wellington Chin
*Assistant Examiner*—Congvan Tran
*Attorney, Agent, or Firm*—Wayne P. Bailey; Paul W. Martin

[57] ABSTRACT

A high-frequency phase locked loop circuit effectively increases the maximum frequency associated with the CMOS technology. The circuit includes a first phase-locked loop sub-circuit having an input and an output, a second phase-locked loop sub-circuit having an input coupled to the input of the first phase-locked loop circuit and an output, and an exclusive-OR circuit having first and second inputs coupled to the outputs of the first and second phase-locked loop sub-circuits and an output. The first and second phase-locked loop may be arranged in parallel or in a master/slave relationship.

23 Claims, 3 Drawing Sheets

5,675,620

HIGH-FREQUENCY PHASE LOCKED LOOP CIRCUIT

BACKGROUND OF THE INVENTION

The present invention relates to phase locked loop circuits, and more specifically to a high-frequency phase locked loop circuit.

Phase-locked loop (PLL) circuits are widely used in electronic systems for clock recovery, frequency synthesis, frequency multiplication, and many other applications. PLL circuits are discussed in the following references:

1. "Phaselock Techniques", by Floyd M. Gardner, John Wiley & Sons, 1979.
2. "Phase-locked Loops—Theory, Design, and Applications", by Dr. Roland E. Best, McGraw-Hill, 1984.

These references are hereby incorporated by reference.

The maximum usable frequency of a PLL circuit is limited by delays within the circuit. One such delay is the intrinsic delay period in the oscillator cell for a given technology. For example, for a ring oscillator-based PLL circuit, a voltage-controlled oscillator within the PLL must have at least three oscillator stages for oscillation to be self-sustainable. Each oscillator stage includes an oscillator cell which produces two delay periods per cycle. Therefore, the overall delay for this PLL circuit is six delay periods per cycle.

Extra delay is caused by control transistors within the oscillator cells. The control transistors are added to control the oscillation frequency, but add extra capacitance and resistance which limit the maximum usable frequency of the PLL circuit.

When the PLL circuit is implemented using 0.7 micron complementary metal oxide semiconductor (CMOS) technology, the six delay periods plus the extra delay result in a maximum usable frequency of about 500 MHz. This frequency is much less than the maximum toggling frequency of logic gates within the circuit, which is at least 2 GHz.

Also, the maximum usable frequency is higher than the maximum design frequency in order for the PLL circuit to lock onto the target frequency. For example, if the design frequency is 500 MHz, the usable frequency must be higher than 500 MHz.

Frequencies higher than the maximum usable frequency of a given technology can usually only be implemented by moving to another technology that is more expensive. For example, silicon bipolar (Si Bipolar) or Gallium Arsenide (GaAs) technologies are typically chosen for high frequency circuits that do not work when implemented with the less expensive CMOS technology.

Therefore, it would be desirable to avoid using more expensive technologies to achieve higher usable frequencies by providing a CMOS PLL circuit which operates at a usable frequency significantly higher than the usable frequency of known CMOS PLL circuits.

SUMMARY OF THE INVENTION

In accordance with the teachings of the present invention, a high-frequency phase locked loop circuit is provided. The circuit includes a first phase-locked loop sub-circuit having an input and an output, a second phase-locked loop sub-circuit having an input coupled to the input of the first phase-locked loop circuit and an output, and an exclusive-OR circuit having first and second inputs coupled to the outputs of the first and second phase-locked loop sub-circuits and an output.

When implemented in using CMOS technology, the circuit of the present invention effectively increases the maximum frequency associated with the CMOS technology. The circuit of the present invention is capable of producing gigahertz output frequencies.

In a first embodiment, the first and second phase-locked loop sub-circuits are arranged in a master/slave relationship in which a voltage-controlled oscillator of the first sub-circuit drives the second sub-circuit.

In a second embodiment, the first and second phase-locked loop sub-circuits arranged in parallel, each sub-circuit having its own voltage-controlled oscillator.

It is accordingly an object of the present invention to provide a high-frequency phase locked loop circuit.

It is another object of the present invention to provide a high-frequency phase locked loop circuit for CMOS technology.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

DETAILED DESCRIPTION OF THE EMBODIMENT

Figure 1:
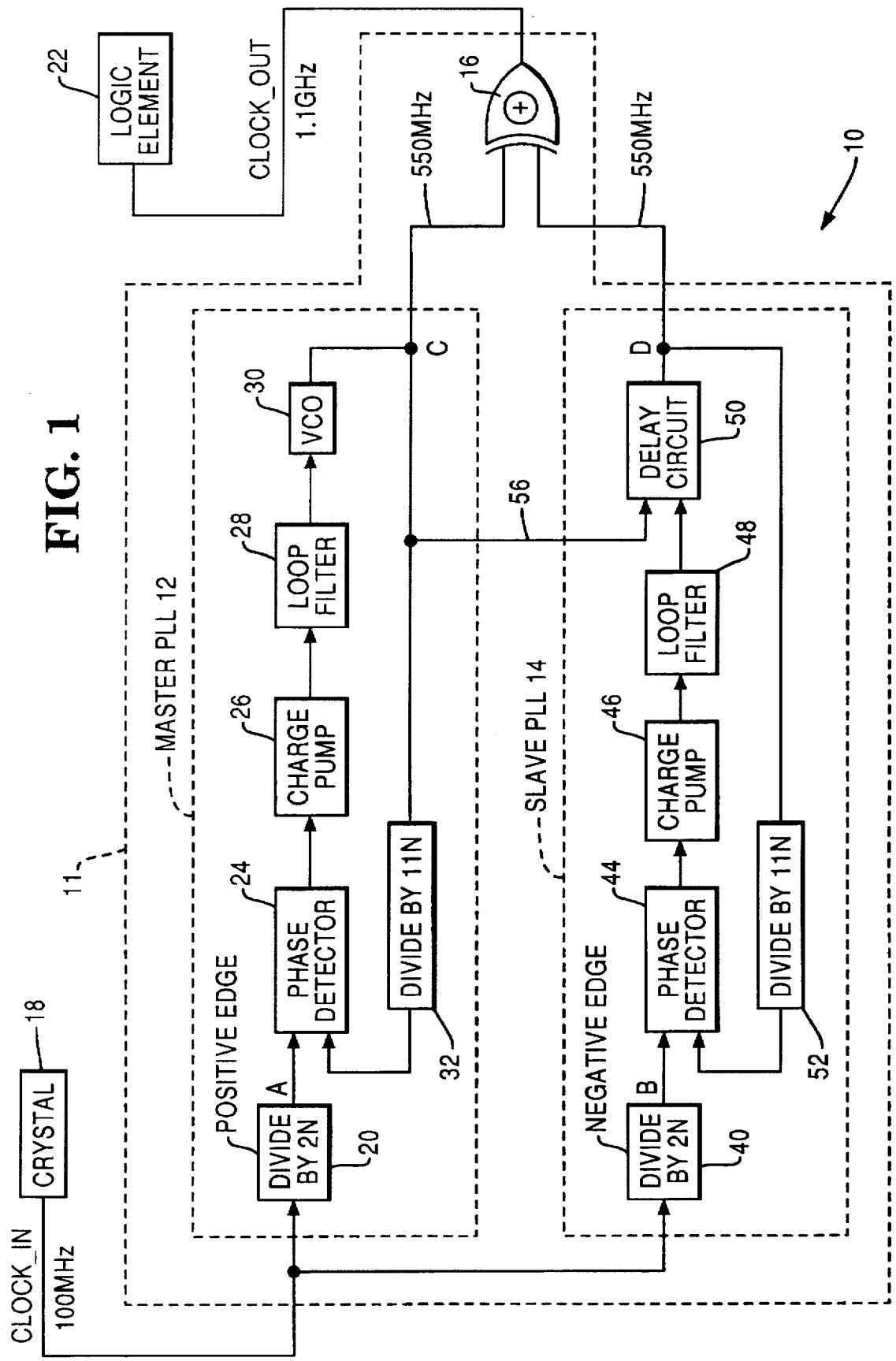
FIG. 1 is a block diagram of a computer circuit including the circuit of the present invention.

Referring now to FIG. 1, computer system 10 includes phase-locked loop (PLL) circuit 11, crystal 18, and logic element 22.

PLL circuit 11 provides signal CLOCK_OUT to logic element 22.

Crystal 18 provides signal CLOCK_IN to PLL circuit 11.

Logic element 22 may be any computer component that requires a clock signal.

In more detail, PLL circuit 11 includes PLL sub-circuit 12, PLL sub-circuit 14, and exclusive-OR gate 16.

PLL sub-circuit 12 includes divide-by-2N circuit 20, phase detector 24, charge pump 26, loop filter 28, voltage-controlled oscillator (VCO) 30, and divide-by-11N circuit 32. The individual functions of components 20, 24, 26, 28, 30, and 32 are well-known in the art.

PLL sub-circuit 14 includes divide-by-2N circuit 40, phase detector 44, charge pump 46, loop filter 48, delay circuit 50, and divide-by-11N circuit 52. The individual functions of components 40, 44, 46, 48, 50, and 52 are well-known in the art.

Since it does not include a voltage-controlled oscillator, PLL sub-circuit 14 acts as a slave PLL circuit to PLL sub-circuit 12, which acts as a master PLL circuit. PLL sub-circuit 12 feeds the signal at node C to node D of PLL sub-circuit 14 over delay line connection 56.

The ratio 2:11 reflected in divide-by-2N circuits 20 and 40, and divide-by-11N circuits 32 and 52, was arbitrarily chosen based on a CLOCK_IN signal frequency of 100 MHz and an output frequency at nodes C and D of master and slave PLL circuits 12 and 14 of 550 MHz. The present invention envisions that other ratios may be used for other frequency constraints. For example, a ratio of 2:10 with a 100 MHz CLOCK_IN signal produces a frequency of 500 MHz at nodes C and D, and a CLOCK_OUT signal frequency of 1.0 GHz. The multiplier N can be any number, but is preferably equal to one.

Figure 2:
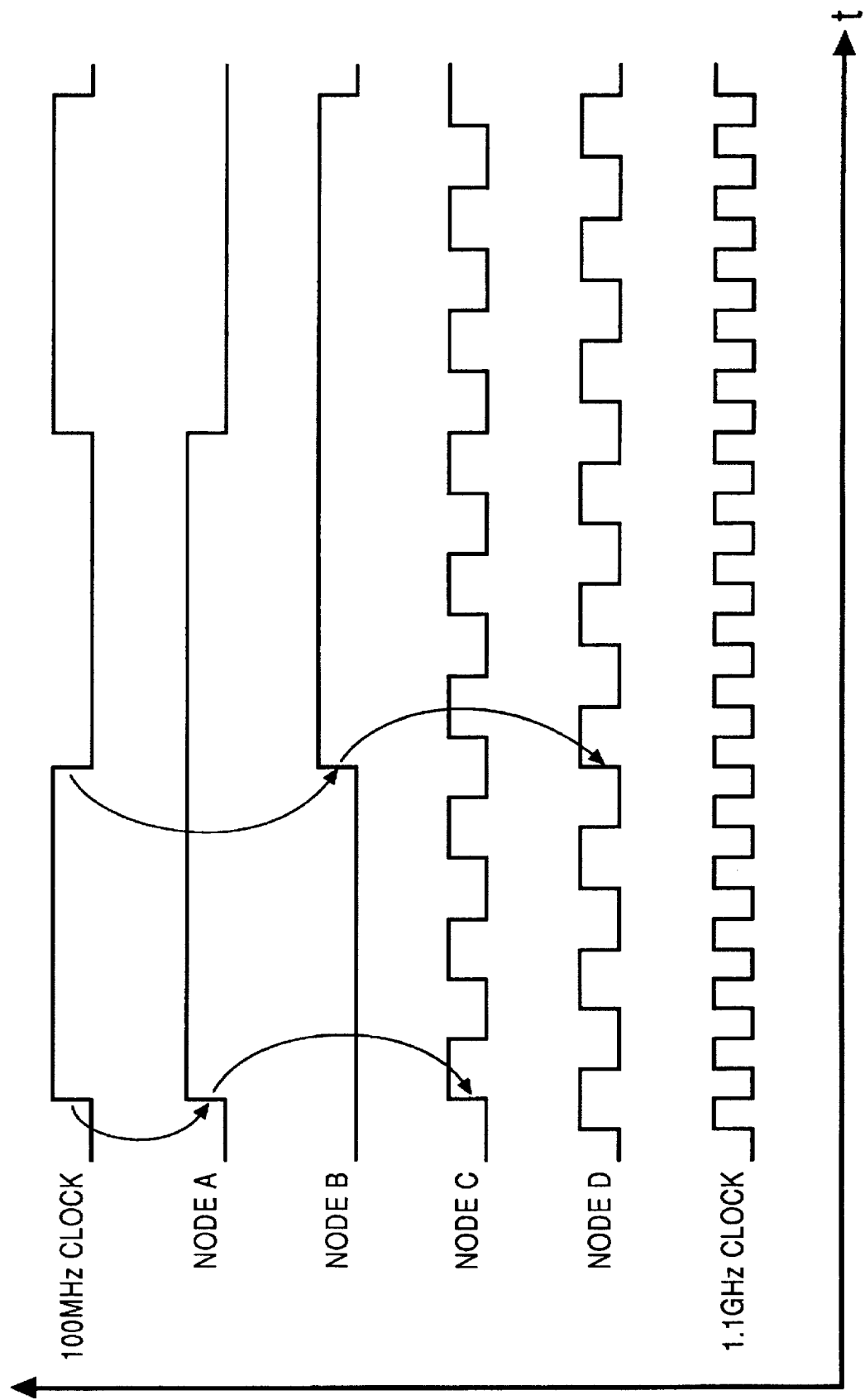
FIG. 2 contains wave form diagrams illustrating the operation of the circuit of the present invention.

With additional reference to FIG. 2, master PLL sub-circuit 12 is triggered by a positive clock edge from crystal 18, while slave PLL 14 is triggered by a negative clock edge from crystal 18. Thus, with multiplier N equal to one, the output frequencies at nodes A and B of divide-by-2N circuits 20 and 40, respectively, is 50 MHz. The signals at nodes A and B are also ninety degrees apart in phase.

With N equal to one, divide-by-11N circuit increases the 50 MHz frequency at node A to 550 MHz at node C. Delay circuit 50 feeds the 550 MHz signal at node C to node D over delay circuit connection 56 (FIG. 1). The signal at node D is locked to the 50 MHz signal at node B, which is phase-shifted one-hundred and eighty degrees from the signal at node A. Thus, a phase difference of ninety degrees being the signals at nodes C and D is maintained.

Figure 3:
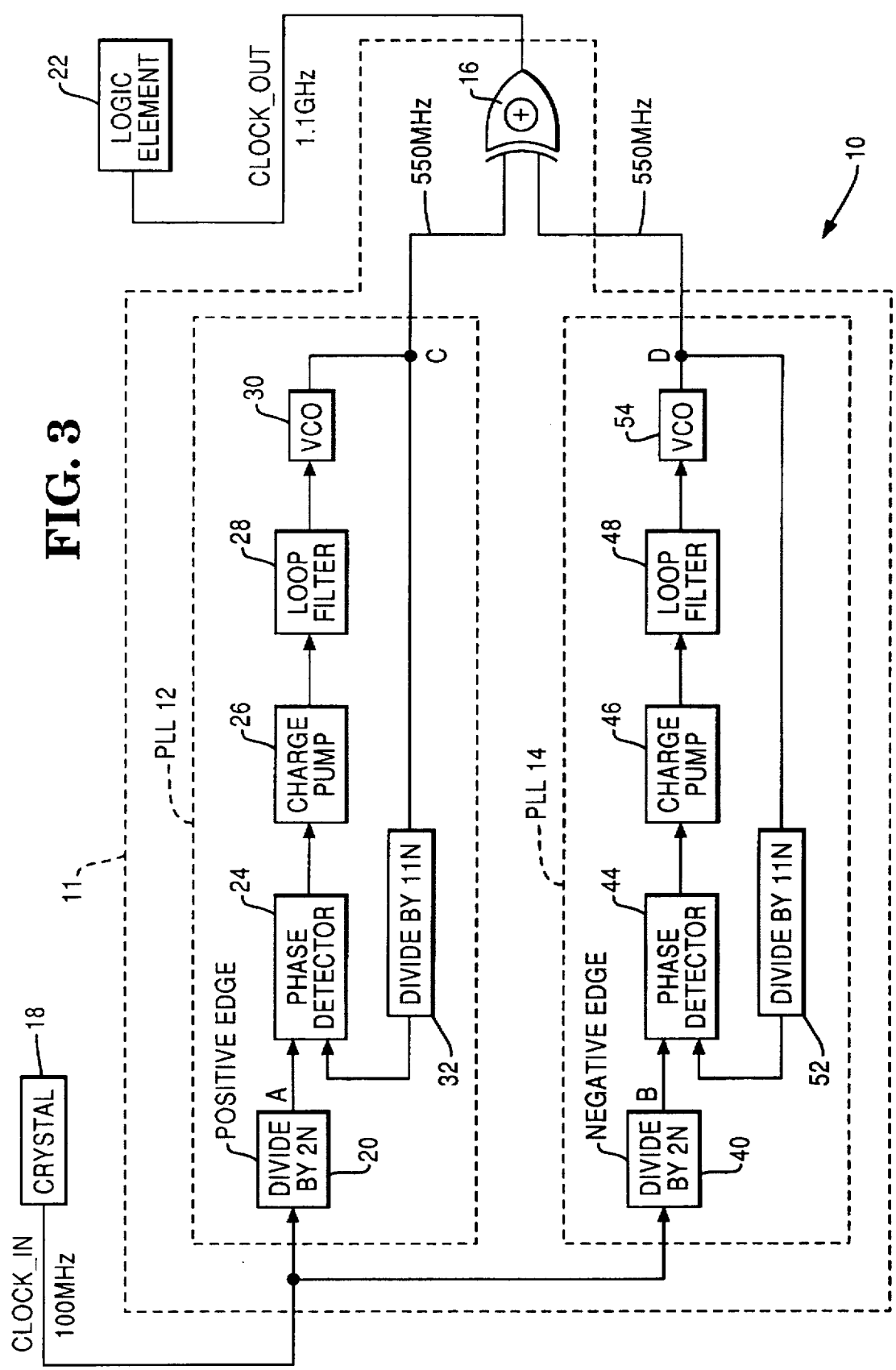
FIG. 3 is a block diagram of a computer circuit including an alternate embodiment of the circuit of the present invention.

With reference to FIG. 3, delay circuit 50 and delay circuit connection 56 may be replaced at greater cost by another voltage-controlled oscillator 54. Thus, there is no master/slave relationship between PLL sub-circuit 12 and PLL sub-circuit 14. With N equal to one, divide-by-11N circuits increase the 50 MHz frequency at nodes A and B, respectively, to 550 MHz at nodes C and D, respectively.

In both the embodiments of FIGS. 1 and 3, the signals at nodes C and D are coupled to exclusive-OR gate 16. Due to the ninety degree phase difference between the signals at nodes C and D, exclusive-OR gate 16 is able to produce a CLOCK_OUT signal having double the frequency, or 1.1 GHz.

Although the present invention has been described with particular reference to certain preferred embodiments thereof, variations and modifications of the present invention can be effected within the spirit and scope of the following claims.

What is claimed is:

1. A circuit comprising:

a first phase-locked loop circuit having an input and an output;

a second phase-locked loop circuit having an input coupled to the input of the first phase-locked loop circuit and an output; and an exclusive-OR circuit having first and second inputs coupled to the outputs of the first and second phase-locked loop circuits and an output, wherein the output of the exclusive-OR circuit provides a clock signal.

2. The circuit as recited in claim 1, wherein the inputs of the first and second phase-locked loop circuits are coupled to a crystal which produces a signal having a predetermined frequency; and wherein the clock signal has an output frequency which is a multiple of the predetermined frequency.

3. A circuit comprising:

a first phase-locked loop circuit having an input and an output;

a second phase-locked loop circuit having an input coupled to the input of the first phase-locked loop circuit and an output; and an exclusive-OR circuit having first and second inputs coupled to the outputs of the first and second phase-locked loop circuits and an output, wherein the inputs of the first and second phase-locked loop circuits are coupled to a crystal which produces a signal having a predetermined frequency; wherein the output of the exclusive-OR circuit provides an output signal having an output frequency which is a multiple of the predetermined frequency; and wherein the circuit comprises CMOS transistors and the output frequency is greater than 500M Hz.

4. A circuit comprising:

a first phase-locked loop circuit having an input and an output;

a second phase-locked loop circuit having an input coupled to the input of the first phase-locked loop circuit and an output; and an exclusive-OR circuit having first and second inputs coupled to the outputs of the first and second phase-locked loop circuits and an output, wherein the inputs of the first and second phase-locked loop circuits are coupled to a crystal which produces a signal having a predetermined frequency; wherein the output of the exclusive-OR circuit provides an output signal having an output frequency which is a multiple of the predetermined frequency; and wherein the circuit comprises CMOS transistors and the output frequency is greater than 1 GHz.

5. The circuit as recited in claim 1, wherein the first phase-locked loop circuit comprises:

a divide-by-N circuit having the input to the first phase-locked loop circuit and an output;

a phase detector having first and second inputs and an output, wherein the first input is coupled to the output of the divide-by-N circuit;

a charge pump having an input coupled to the output of the phase detector and an output;

a loop filter having an input coupled to the output of the charge pump and an output;

a voltage-controlled oscillator having an input coupled to the output of the loop filter and an output coupled to the first input of the exclusive-OR circuit; and a divide-by-M circuit having an input coupled to the output of the voltage-controlled oscillator and an output coupled to the second input of the phase detector.

6. The circuit as recited in claim 5, wherein the second phase-locked loop circuit comprises:

a divide-by-O circuit having the input to the second phase-locked loop circuit and an output;

a phase detector having first and second inputs and an output, wherein the first input is coupled to the output of the divide-by-O circuit;

a charge pump having an input coupled to the output of the phase detector and an output;

a loop filter having an input coupled to the output of the charge pump and an output;

a voltage-controlled oscillator having an input coupled to the output of the loop filter and an output coupled to the second input of the exclusive-OR circuit; and a divide-by-P circuit having an input coupled to the output of the voltage-controlled oscillator and an output coupled to the second input of the phase detector.

7. A circuit comprising:

a first phase-locked loop circuit having an input and an output; a second phase-locked loop circuit having an input coupled to the input of the first phase-locked loop circuit and an output; and an exclusive-OR circuit having first and second inputs coupled to the outputs of the first and second phase-locked loop circuits and an output;

wherein the first phase-locked loop circuit comprises:
  a divide-by-N circuit having the input to the first phase-locked loop circuit and an output;
  a phase detector having first and second inputs and an output, wherein the first input is coupled to the output of the divide-by-N circuit;
  a charge pump having an input coupled to the output of the phase detector and an output;
  a loop filter having an input coupled to the output of the charge pump and an output;
  a voltage-controlled oscillator having an input coupled to the output of the loop filter and an output coupled to the first input of the exclusive-OR circuit; and
  a divide-by-M circuit having an input coupled to the output of the voltage-controlled oscillator and an output coupled to the second input of the phase detector;

and wherein the second phase-locked loop circuit comprises:
  a divide-by-O circuit having the input to the second phase-locked loop circuit and an output;
  a phase detector having first and second inputs and an output, wherein the first input is coupled to the output of the divide-by-O circuit;
  a charge pump having an input coupled to the output of the phase detector and an output;
  a loop filter having an input coupled to the output of the charge pump and an output;
  a voltage-controlled oscillator having an input coupled to the output of the loop filter and an output coupled to the second input of the exclusive-OR circuit; and
  a divide-by-P circuit having an input coupled to the output of the voltage-controlled oscillator and an output coupled to the second input of the phase detector;

wherein the inputs of the first and second phase-locked loop circuits are coupled to a crystal which produces an input signal having a predetermined input frequency; wherein ratios M:N and P:O are equal to a common ratio; and wherein the output of the exclusive-OR circuit provides an output signal having an output frequency which is equal to the input frequency multiplied by twice the common ratio.

8. The circuit as recited in claim 7, wherein the divide-by-N circuit triggers on a positive edge of the input signal from the crystal and the divide-by-O circuit triggers on a negative edge of the input signal from the crystal.

9. The circuit as recited in claim 8, wherein a first signal at the first input of the exclusive-OR circuit and a second signal at the second input of the exclusive-OR circuit differ in phase by about ninety degrees.

10. A circuit comprising:
  a first phase-locked loop circuit having an input and an output;
  a second phase-locked loop circuit having an input coupled to the input of the first phase-locked loop circuit and an output; and
  an exclusive-OR circuit having first and second inputs coupled to the outputs of the first and second phase-locked loop circuits and an output, wherein the first phase-locked loop circuit comprises:
    a divide-by-N circuit having the input to the first phase-locked loop circuit and an output;
    a phase detector having first and second inputs and an output, wherein the first input is coupled to the output of the divide-by-N circuit;
    a charge pump having an input coupled to the output of the phase detector and an output;
    a loop filter having an input coupled to the output of the charge pump and an output;
    a voltage-controlled oscillator having an input coupled to the output of the loop filter and an output coupled to the first input of the exclusive-OR circuit; and
    a divide-by-M circuit having an input coupled to the output of the voltage-controlled oscillator and an output coupled to the second input of the phase detector, wherein the first phase-locked loop circuit comprises a master phase-locked loop circuit, and wherein the second phase-locked loop circuit comprises a slave phase-locked loop circuit which is clocked by the master phase-locked loop circuit.

11. A circuit comprising:
  a first phase-locked loop circuit having an input and an output; a second phase-locked loop circuit having an input coupled to the input of the first phase-locked loop circuit and an output; and an exclusive-OR circuit having first and second inputs coupled to the outputs of the first and second phase-locked loop circuits and an output;

wherein the first phase-locked loop circuit comprises:
  a divide-by-N circuit having the input to the first phase-locked loop circuit and an output;
  a phase detector having first and second inputs and an output, wherein the first input is coupled to the output of the divide-by-N circuit;
  a charge pump having an input coupled to the output of the phase detector and an output;
  a loop filter having an input coupled to the output of the charge pump and an output;
  a voltage-controlled oscillator having an input coupled to the output of the loop filter and an output coupled to the first input of the exclusive-OR circuit; and
  a divide-by-M circuit having an input coupled to the output of the voltage-controlled oscillator and an output coupled to the second input of the phase detector, wherein the first phase-locked loop circuit comprises a master phase-locked loop circuit, and wherein the second phase-locked loop circuit comprises a slave phase-locked loop circuit which is clocked by the master phase-locked loop circuit;

wherein the second phase-locked loop circuit comprises:
  a divide-by-O circuit having the input to the second phase-locked loop circuit and an output;
  a phase detector having first and second inputs and an output, wherein the first input is coupled to the output of the divide-by-O circuit;
  a charge pump having an input coupled to the output of the phase detector and an output;
  a loop filter having an input coupled to the output of the charge pump and an output;
  a delay circuit having a first input coupled to the output of the loop filter, a second input coupled to the output of the voltage-controlled oscillator of the first phase-locked loop circuit, and an output coupled to the second input of the exclusive-OR circuit; and
  a divide-by-P circuit having an input coupled to the output of the delay circuit and an output coupled to the second input of the phase detector.

12. The circuit as recited in claim 11, wherein the inputs of the first and second phase-locked loop circuits are coupled to a crystal which produces an input signal having a predetermined input frequency; wherein ratios M:N and P:O are equal to a common ratio; and wherein the output of the exclusive-OR circuit provides an output signal having an output frequency which is equal to the input frequency multiplied by twice the common ratio.

13. The circuit as recited in claim 12, wherein the divide-by-N circuit triggers on a positive edge of the input signal from the crystal and the divide-by-O circuit triggers on a negative edge of the input signal from the crystal.

14. The circuit as recited in claim 13, wherein a first signal at the first input of the exclusive-OR circuit and a second signal at the second input of the exclusive-OR circuit differ in phase by about ninety degrees.

15. A CMOS phase-locked loop circuit comprising:
a first phase-locked loop sub-circuit having an input and an output, including
   a divide-by-N circuit having the input to the first phase-locked loop sub-circuit and an output; and
   a first circuit including
      a phase detector having a first input coupled to the output of the divide-by-N circuit, and a second input; and
      a divide-by-M circuit having an input coupled to the output of the first phase-locked loop sub-circuit, and an output coupled to the second input of the phase detector;
a second phase-locked loop sub-circuit having an input coupled to the input of the first phase-locked loop sub-circuit and an output, including
   a divide-by-N circuit having the input to the second phase-locked loop sub-circuit and an output; and
   a second circuit including
      a phase detector having a first input coupled to the output of the divide-by-N circuit, and a second input; and
      a divide-by-M circuit having an input coupled to the output of the second phase-locked loop sub-circuit, and an output coupled to the second input of the phase detector; and
an exclusive-OR circuit having first and second inputs coupled to the outputs of the first and second phase-locked loop sub-circuits and an output;
wherein the output of the exclusive-OR circuit provides an output signal having an output frequency which is equal to an input frequency of an input signal applied to the inputs of the first and second phase-locked loop sub-circuits multiplied by twice the ratio M:N.

16. A CMOS circuit comprising:
a master phase-locked loop sub-circuit having an input and an output, including
   a divide-by-N circuit having the input to the master phase-locked loop sub-circuit and an output; and
   a first circuit including
      a phase detector having a first input coupled to the output of the divide-by-N circuit, and a second input;
      a voltage-controlled oscillator having an output coupled to the output of the master phase-locked loop sub-circuit; and
      a divide-by-M circuit having an input coupled to the output of the voltage-controlled oscillator and an output coupled to the second input of the phase detector;
a slave phase-locked loop sub-circuit having an input coupled to the input of the master phase-locked loop sub-circuit and an output, including a divide-by-N circuit having the input to the slave phase-locked loop sub-circuit and an output; and
a second circuit including
   a phase detector having a master input coupled to the output of the divide-by-N circuit, and a second input;
   a delay circuit having an input coupled to the output of the voltage-controlled oscillator of the master phase-locked loop sub-circuit, and an output coupled to the output of the slave phase-locked loop sub-circuit; and
   a divide-by-M circuit having an input coupled to the output of the delay circuit and an output coupled to the second input of the phase detector; and
an exclusive-OR circuit having master and second inputs coupled to the outputs of the master and slave phase-locked loop sub-circuits and an output;
wherein the output of the exclusive-OR circuit provides an output signal having an output frequency which is equal to an input frequency of an input signal applied to the inputs of the master and slave phase-locked loop sub-circuits multiplied by twice the ratio M:N.

17. A system comprising:
a crystal which produces an output signal having an output frequency;
a phase-locked loop circuit comprising:
   a first phase-locked loop sub-circuit having an input coupled to the crystal output signal, and an output;
   a second phase-locked loop sub-circuit having an input coupled to the input of the first phase-locked loop sub-circuit and an output; and
   an exclusive-OR circuit having first and second inputs coupled to the outputs of the first and second phase-locked loop sub-circuits and an output which produces an output signal having an output frequency which is a predetermined multiple of the output frequency; and
a logic element coupled to the output of the exclusive-OR circuit.

18. A method for producing a clock signal having a frequency comprising the steps of:
producing a first signal, having half of the frequency, by a first phase-locked loop circuit;
producing a second signal, having half the frequency and differing ninety degrees in phase from the first signal, by a second phase-locked loop circuit; and
coupling the first and second signals to an exclusive-OR logic element.

19. A circuit comprising:
a first phase-locked loop circuit having an input and an output;
a second phase-locked loop circuit having an input coupled to the input of the first phase-locked loop circuit and an output; and
an exclusive-OR circuit having first and second inputs coupled to the outputs of the first and second phase-locked loop circuits and an output, wherein a first signal at the first input of the exclusive-OR circuit and a second signal at the second input of the exclusive-OR circuit differ in phase by about ninety degrees.

20. The circuit as recited in claim 1, wherein the clock signal has a frequency greater than signal frequency at the first input of the exclusive-OR circuit.

21. The circuit as recited in claim 1, wherein the clock signal has a frequency greater than signal frequency at the first and second inputs of the exclusive-OR circuit.

22. The circuit as recited in claim 1, wherein the first phase-locked loop circuit comprises a master phase-locked loop circuit, and wherein the second phase-locked loop circuit comprises a slave phase-locked loop circuit which is clocked by the master phase-locked loop circuit.

23. The circuit as recited in claim 17, wherein a first signal at the first input of the exclusive-OR circuit and a second signal at the second input of the exclusive-OR circuit differ in phase by about ninety degrees.

* * * * *